(12) United States Patent  
Momose et al.

(10) Patent No.: US 11,829,054 B2  
(45) Date of Patent: Nov. 28, 2023

(54) ELECTRONIC APPARATUS COMPRISING AN INTERFACE UNIT COMPRISING A CONNECTION UNIT, A HEAT TRANSFER UNIT, A HEAT DISSIPATION UNIT, AND A FIXATION MEMBER

(71) Applicant: CANON KABUSHIKI KAISHA, Tokyo (JP)

(72) Inventors: Hideaki Momose, Kanagawa (JP); Shinji Obana, Tokyo (JP); Kanae Nakamori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/720,976

(22) Filed: Apr. 14, 2022

(65) Prior Publication Data

US 2022/0338379 A1 Oct. 20, 2022

(30) Foreign Application Priority Data

Apr. 16, 2021 (JP) ................................. 2021-069720

(51) Int. Cl.
| | |
|---|---|
| *G03B 17/55* | (2021.01) |
| *F25B 21/02* | (2006.01) |
| *G03B 17/56* | (2021.01) |
| *H05K 7/20* | (2006.01) |
| *H01L 23/38* | (2006.01) |

(52) U.S. Cl.
CPC ............ *G03B 17/55* (2013.01); *F25B 21/02* (2013.01); *G03B 17/56* (2013.01); *H05K 7/20409* (2013.01); *H05K 7/20445* (2013.01); *F25B 2321/023* (2013.01);

(Continued)

(58) Field of Classification Search
CPC .......... H05K 7/20154–20163; H05K 7/20454; H05K 7/205; G06F 1/20; H01L 23/38; H01L 23/40–4006; F25B 21/02; F25B 2321/023; F25B 2321/025; G03B 17/55; G03B 17/56

See application file for complete search history.

(56) References Cited

U.S. PATENT DOCUMENTS 5,898,569 A * 4/1999 Bhatia ...................... G06F 1/203  
                                                                    361/679.48  
10,481,656 B2 * 11/2019 Casparian ............. G06F 1/1632

(Continued)

FOREIGN PATENT DOCUMENTS

| JP | 2009071516 A | 4/2009 |
|---|---|---|
| JP | 2019114893 A * | 7/2019 |

(Continued)

*Primary Examiner* — Zachary Pape  
(74) *Attorney, Agent, or Firm* — Canon U.S.A., Inc. IP Division

(57) ABSTRACT

An electronic apparatus includes an interface unit including a connection unit, a heat transfer unit, a heat dissipation unit, and a fixation member. The connection unit is attachable to an interface terminal of an external apparatus. The fixation member is couplable to a fixation unit of the external apparatus. When the electronic apparatus is attached to the external apparatus, the heat dissipation unit, the heat transfer unit, and the interface unit are arranged in a layered manner in this order and are thermally coupled, and, along therewith, the fixation member is thermally coupled to the heat dissipation unit and the fixation unit.

6 Claims, 9 Drawing Sheets

(52) U.S. Cl.
CPC ....... *F25B 2321/0251* (2013.01); *H01L 23/38* (2013.01); *H05K 7/20163* (2013.01); *H05K 7/20454* (2013.01)

(56) References Cited

U.S. PATENT DOCUMENTS

| | | | |
|---|---|---|---|
| 10,809,486 B2 * | 10/2020 | Hosoe | H04N 23/60 |
| 11,190,671 B2 * | 11/2021 | Wada | H05K 7/20154 |
| 11,310,401 B2 * | 4/2022 | Makara | H05K 7/20209 |

FOREIGN PATENT DOCUMENTS

| | | | |
|---|---|---|---|
| WO | WO-2021182344 A1 * | 9/2021 | |
| WO | WO-2021251194 A1 * | 12/2021 | |
| WO | WO-2022201882 A1 * | 9/2022 | |

* cited by examiner

ELECTRONIC APPARATUS COMPRISING AN INTERFACE UNIT COMPRISING A CONNECTION UNIT, A HEAT TRANSFER UNIT, A HEAT DISSIPATION UNIT, AND A FIXATION MEMBER

BACKGROUND

Field of the Disclosure

The present disclosure relates to an electronic apparatus, and, in particular, to an electronic apparatus for, for example, an imaging apparatus including an interface connectable to another electronic apparatus.

Description of the Related Art

In recent years, the widespread use of moving image viewing applications and moving image distribution services has led to a growing demand for imaging apparatuses capable of capturing a high-quality moving image for a long time. Under these circumstances, a reduction in imaging noise, improvement of a perceived resolution, and the like have been realized by mounting advanced video engines on control boards inside imaging apparatuses.

To reduce an increase in the temperature of an electronic component due to heat generation accompanying the moving image capturing lasting for a long time or the like, for example, there has been proposed an imaging apparatus in which a heat generation member inside a housing can be forcibly cooled by an air-cooling blowing duct formed inside the housing and a heat dissipater mounted thereon (Japanese Patent Application Laid-Open No. 2009-071516).

However, in the technique discussed in Japanese Patent Application Laid-Open No. 2009-071516, the blowing duct inside the imaging apparatus is arranged so that a wide space for setting up the blowing duct is required, which may hinder a reduction in the size of the imaging apparatus.

SUMMARY

Some embodiments of the present disclosure have been made in consideration of the above-described problem, and are directed to providing an externally connectable electronic apparatus mounted on an imaging apparatus and capable of reducing an increase in a temperature inside the imaging apparatus.

According to an aspect of the present disclosure, an electronic apparatus includes an interface unit including a connection unit, a heat transfer unit, a heat dissipation unit, and a fixation member. The connection unit is attachable to an interface terminal of an external apparatus. The fixation member is couplable to a fixation unit of the external apparatus. When the electronic apparatus is attached to the external apparatus, the heat dissipation unit, the heat transfer unit, and the interface unit are arranged in a layered manner in this order and are thermally coupled, and, along therewith, the fixation member is thermally coupled to the heat dissipation unit and the fixation unit.

Further features of various embodiments will become apparent from the following description of exemplary embodiments with reference to the attached drawings.

DESCRIPTION OF THE EMBODIMENTS

In the following description, representative exemplary embodiments of the present disclosure will be described in detail with reference to the accompanying drawings. The exemplary embodiments that will be described below are merely examples that embody the present disclosure, and may be modified or changed as appropriate according to the configuration of an apparatus to which the present disclosure is applied and various conditions. The respective configurations of the exemplary embodiments can also be appropriately combined to each other or one another.

A first exemplary embodiment of the present disclosure will be described below. In the following description, an electronic apparatus 10 according to the first exemplary embodiment of the present disclosure will be described with reference to FIGS. 1A to 1C to 4A and 4B.

Figure 1A:
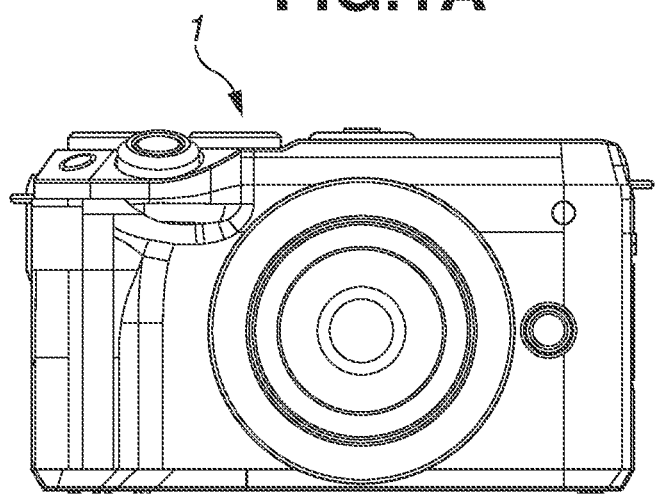
FIGS. 1A to 1C are external views and a schematic view of an imaging apparatus according to a first exemplary embodiment of the present disclosure.
Figure 1B:
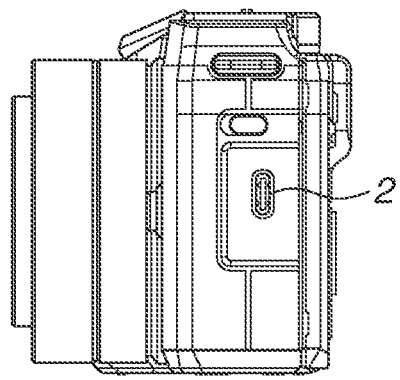
Figure 1C:
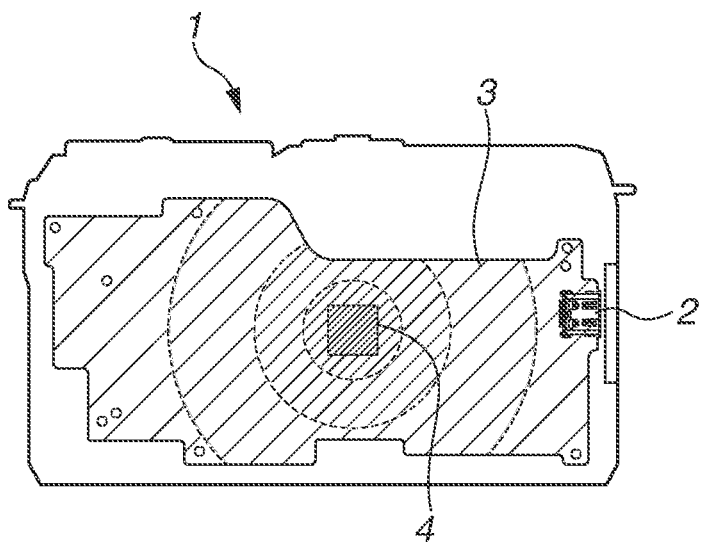

FIGS. 1A to 1C are external views and a schematic view of an imaging apparatus 1 (an external apparatus) according to the present exemplary embodiment. FIG. 1A is a front view of the imaging apparatus 1 according to the present exemplary embodiment. FIG. 1B is a side view of the imaging apparatus 1 according to the present exemplary embodiment. FIG. 1C is a schematic view of the inside of the imaging apparatus 1 according to the present exemplary embodiment.

On the imaging apparatus 1 according to the present exemplary embodiment, a lens unit is mounted on an imaging apparatus main body. The present exemplary embodiment will be described omitting the description about a detailed structure of the imaging apparatus 1 and focusing only on portions necessary for the description of the present disclosure. The imaging apparatus 1 is equipped with a receptacle connector 2 disposed on the side surface portion of the main body. The receptacle connector 2 (an interface terminal) is a connector that enables the imaging apparatus 1 to be mechanically connected and electrically connected to an external interface. The receptacle connector 2 supports a general-purpose interface, and examples thereof include interfaces based on the Universal Serial Bus (USB) standard and the High-Definition Multimedia Interface (HDMI)® standard. The receptacle connector 2 is mounted on a control board 3. Besides the receptacle connector 2, various electronic components, such as a control integrated circuit (IC) (a heat generation electronic component) 4, are mounted on the control board 3, and the control board 3 controls the main operation of the imaging apparatus 1. When a moving image is captured or still images are continuously captured at a high speed using the imaging apparatus 1, a throughput for electric signals increases due to an influence of image processing and the like. As a result, an element package of the control IC 4 generates heat.

In a case where a moving image is captured or still images are continuously captured at a high speed for a long time, the temperature of the control IC 4 increases, the heat generated at the control IC 4 propagates to, for example, a conductive layer and an insulating layer of the control board 3, and the temperature of the control board 3 increases. FIG. 1C schematically illustrates how the heat generated at the control IC 4 propagates to the control board 3 with the density of hatching, and the heat generated at the control IC 4 also propagates to the receptacle connector 2 mounted on the control board 3 and the temperature of the receptacle connector 2 increases. If a moving image is continuously captured or still images are continually captured at a high speed for a predetermined time or longer and heat generation electronic components, such as the control IC 4 mounted on the control board 3, end up reaching such high temperatures that exceed the respective guaranteed operating temperatures, this would lead to, for example, damage on the electronic components or the control board 3. Thus, the damage due to the heat generation may be prevented by setting a certain limit on a time period for which a moving image can be continuously recorded or the number of images by which still images can be continually captured at a high speed. However, setting such an operational limit on the imaging apparatus 1 reduces the convenience when a user uses the imaging apparatus 1, and therefore it is desirable to set no operational limit while controlling the increases in the temperatures of the heat generation electronic components, such as the control IC 4, as much as possible.

Figure 2A:
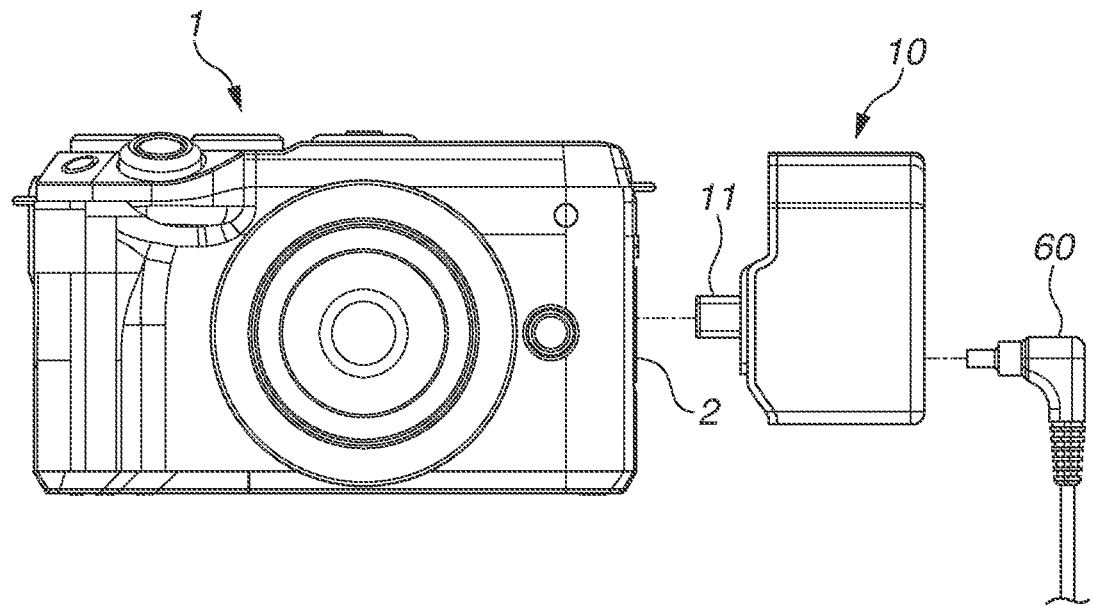
FIGS. 2A and 2B illustrate how a heat dissipater is attached to the imaging apparatus according to the first exemplary embodiment of the present disclosure.
Figure 2B:
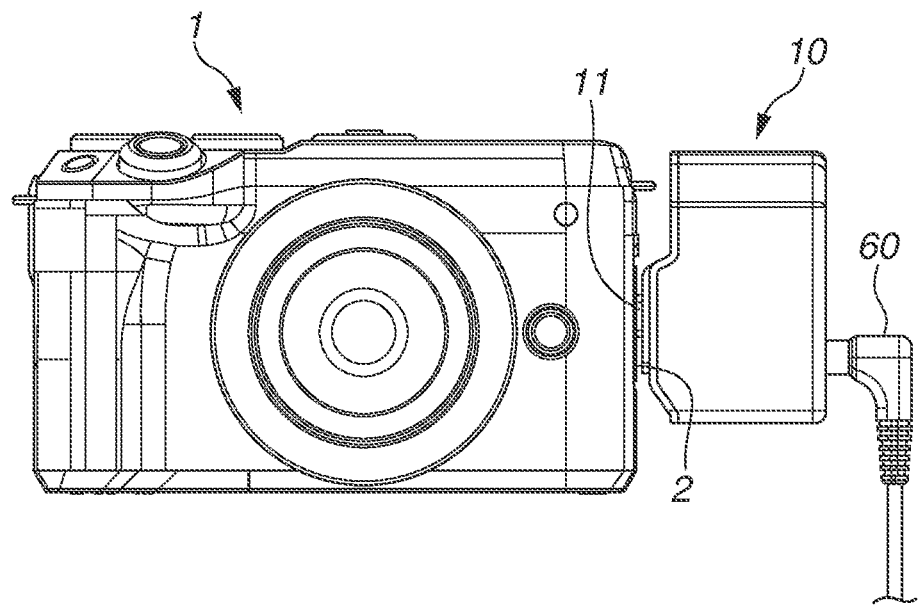

Next, a method for attaching an electronic apparatus (a heat dissipater) 10 to the imaging apparatus 1 will be described with reference to FIGS. 2A and 2B. The electronic apparatus 10 can be coupled to the imaging apparatus 1. FIGS. 2A and 2B are front views illustrating how the electronic apparatus 10 is attached to the imaging apparatus 1 according to the present exemplary embodiment. FIG. 2A illustrates the imaging apparatus 1 and the electronic apparatus 10 before the attachment, and FIG. 2B illustrates the imaging apparatus 1 and the electronic apparatus 10 after the attachment. The electronic apparatus 10 is attachable to the imaging apparatus 1. The details of the internal configuration of the electronic apparatus 10 will be described below. The electronic apparatus 10 includes a plug 11 (an interface unit). The plug 11 is mechanically connectable to a receptacle connector supporting the general-purpose interface, and has a plug-side shape (or a header shape and a male shape) in compliance with the same interface standard as the receptacle connector 2 of the imaging apparatus 1. The plug 11 is mechanically connectable to the receptacle connector 2, and is mainly made from a metallic material. The electronic apparatus 10 is configured in such a manner that a power source cable 60 is attachable thereto. The power source cable 60 is attached to the electronic apparatus 10, and the other side of the power source cable 60 is connected to a not-illustrated power source unit, so that the electronic apparatus 10 receives power source supply. The operation and the function of the electronic apparatus 10 will also be described in detail below separately.

Figure 3A:
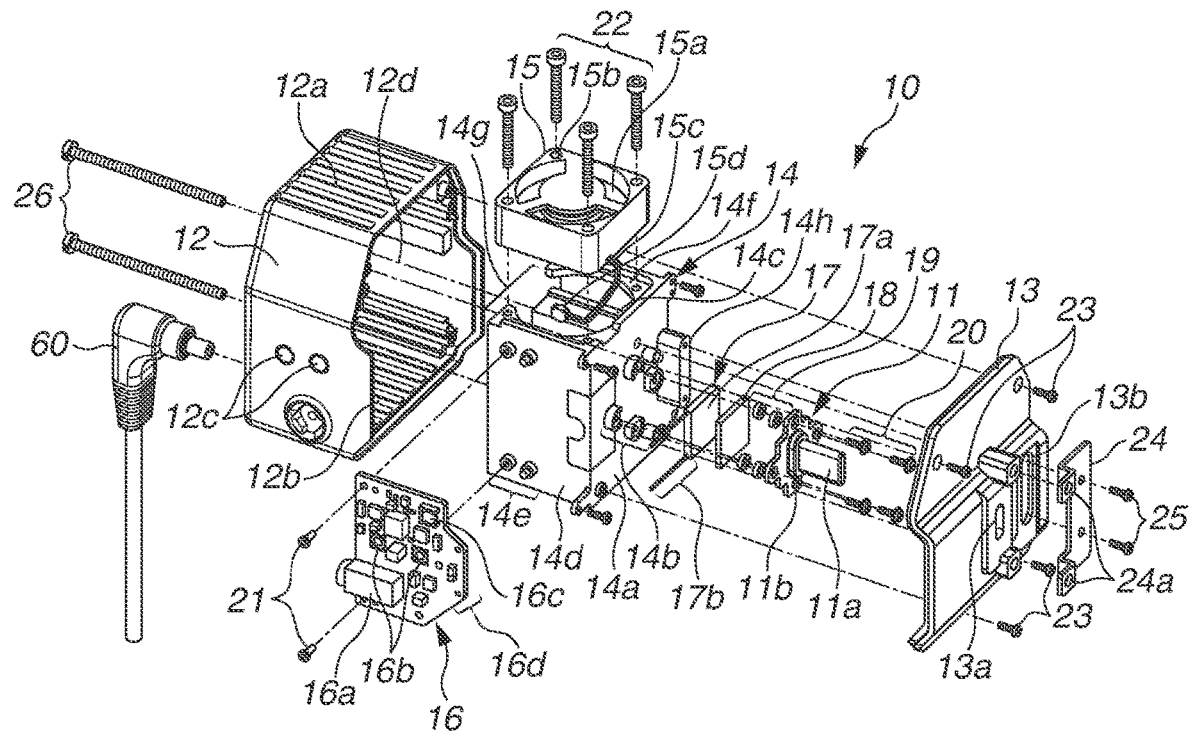
FIGS. 3A and 3B are exploded perspective views of the electronic apparatus (the heat dissipater) according to the first exemplary embodiment of the present disclosure.
Figure 3B:
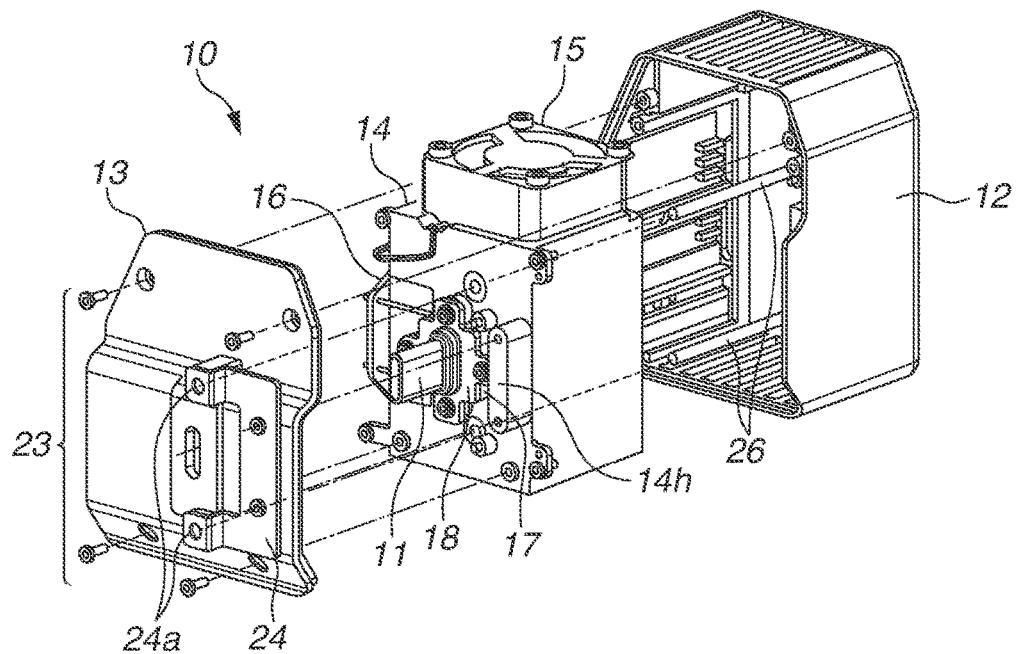

Next, details of the internal configuration of the electronic apparatus 10 will be described with reference to FIGS. 3A and 3B. FIGS. 3A and 3B are exploded perspective views of the electronic apparatus 10 according to the present exemplary embodiment. The electronic apparatus 10 is configured in such a manner that various components including the plug 11 are housed in a container case 12, and a cover 13 is combined together therewith after that. Initially, the electronic apparatus 10 includes heat dissipation fins 14 (a heat dissipation unit). The heat dissipation fins 14 include a fixation unit 14b formed on a main surface 14a. The fixation unit 14b mainly includes four screw fixation holes. A plurality of fins 14c is erected from the main surface 14a in an opposite direction from the surface on which the fixation unit 14b is disposed. For the heat dissipation fins 14, the main surface 14a, the fixation unit 14b, and the fins 14c are integrally formed through mold casting (die casting) using an alloy material, such as aluminum, magnesium, and zinc. A Peltier device 17 (a heat transfer unit) is disposed in an inner region surrounded by the four screw fixation holes of the fixation unit 14b. The Peltier device 17 is a semiconductor element utilizing the Peltier effect, and includes a rectangularly processed main body portion 17a and two terminal portions 17b extending from the main body portion 17a. A heat transfer rubber 18 (an elastic member) is disposed to be in in contact with the main body portion 17a. The heat transfer rubber 18 is an elastic and highly thermally conductive rubber sheet, and is formed by adding various mixture materials to, for example, silicon rubber serving as a basis. The external shape of the heat transfer rubber 18 is processed into approximately the same shape as the main body portion 17a of the Peltier device 17, and the heat transfer rubber 18 is glued to the Peltier device 17. Further, the plug 11 is disposed to be in in contact with the heat transfer rubber 18. The plug 11 includes a connection unit 11a and a fixation unit 11b, and the connection unit 11a is exposed from an opening portion 13a formed on the cover 13 when the electronic apparatus 10 is assembled. The fixation unit 11b is shaped like a flat plate, and includes four through-holes laid out so as to surround the connection unit 11a. The layout of the through-holes is arranged in correspondence with the layout of the screw fixation holes of the fixation unit 14b. With the Peltier device 17, the heat transfer rubber 18, and the plug 11 arranged in a layered manner in this order starting from one closer to the main surface 14a of the heat dissipation fins 14, they are fixedly held to the heat dissipation fins 14 by tightening four screws 20 from the through-hole side of the fixation unit 11b toward the screw fixation holes of the fixation unit 14b. At this time, four resin washers 19 are inserted between the fixation unit 11b of the plug 11 and the fixation unit 14b of the heat dissipation fins 14.

Next, for the heat dissipation fins 14, a fixation unit 14e is formed on a side surface 14d perpendicular to the main surface 14a. The fixation unit 14e mainly includes two screw fixation holes. A printed circuit board 16 is disposed on the side surface 14d, and is fixedly held by two screws 21. Further, the heat dissipation fins 14 include a fixation unit 14g formed on an upper surface 14f perpendicular to each of the main surface 14a and the side surface 14d. The fixation unit 14g includes four screw fixation holes. A fan 15 is disposed on the upper surface 14f. The fan 15 has the configuration of a so-called axial-flow fan motor, and a copper wire coil and a not-illustrated board electrically connected to various electronic components are mounted on a stator disposed at the center of a rectangular frame member thereof, and a blade 15a with a magnet mounted thereon is formed in a rotor portion. Four through-holes 15b are provided at the corner portions of the frame member. The fan 15 is fixedly held by tightening four screws 22 from the through-hole 15b side of the fan 15 toward the fixation unit 14g. A power source jack connector 16a is mounted on the printed circuit board 16. The power source jack connector 16a is connectable to the power source cable 60, and supplies a power source from outside to the printed circuit board 16. Further, tactile switches 16b are mounted on the printed circuit board 16. The tactile switches 16b are configured to be pressed when operation buttons 12c formed on the container case 12 are operated with the assembling of the electronic apparatus 10 completed. The operation buttons 12c are arranged to face an imaging apparatus operator side when the electronic apparatus 10 is attached to the imaging apparatus 1, and are configured so that the imaging apparatus operator is enabled to smoothly shift from the operation of the imaging apparatus 1 to the operation of the electronic apparatus 10.

Further, a connector 16c is mounted on the printed circuit board 16. The connector 16c is electrically connected to the fan 15. On the fan 15, a lead wire 15c extends from the board disposed in the stator portion, and a header-type connector 15d is fittable to the connector 16c and is joined to the distal end of the lead wire 15c. The fan 15 is put into operation by a driving and control circuit of the fan 15 that includes various electronic components mounted on the printed circuit board 16. An exhaust port 12a including a plurality of slits is formed on a surface of the container case 12 that faces the fan 15. An intake port 12b is formed on a surface opposite to the exhaust port 12a. The intake port 12b also has a plurality of slits as in the exhaust port 12a. When the heat dissipation fins 14 are contained inside the container case 12, a duct 12d, which connects the exhaust port 12a and the intake port 12b, is formed. When the fan 15 is driven, a flow path is formed in such a manner that external air is introduced from the intake port 12b, passes through the duct 12d and the fins 14c, and is exhausted to the exhaust port 12a. Further, a conductor land 16d including a through-hole through which the distal end of the terminal portion 17b of the Peltier device 17 can be inserted is formed on the printed circuit board 16. The Peltier device 17 is fixedly held to the heat dissipation fins 14 first, and, after that, the printed circuit board 16 is fixedly held to the heat dissipation fins 14 by inserting the respective terminal portions 17b through the conductor land 16d. After that, the terminal portions 17b and the conductor land 16d are electrically connected by soldering or the like. The Peltier device 17 17 is put into operation by a driving and control circuit of the Peltier device 17 that includes various electronic components mounted on the printed circuit board 16. The Peltier device 17 is configured in such a manner that, when the Peltier device 17 operates, a flat surface side thereof facing the heat transfer rubber 18 serves as a heat absorption surface and a flat surface side thereof facing the heat dissipation fins 14 serves as a heat generation surface. The plug 11 is then cooled via the heat transfer rubber 18, and the heat of the Peltier device 17 dissipates to the heat dissipations fin 14 conversely. After the mounting of the above-described various members onto the heat dissipation fins 14 is completed, the heat dissipation fins 14 are fixed to the container case 12, and, further, the cover 13 is installed thereon and screws 23 are tightened. A fixation metal plate 24 (a fixation member) is fixed to a fixation unit 14h provided on the heat dissipation fins 14 using screws 25. An opening portion 13b is formed on the cover 13, and the heat dissipation fins 14 and the fixation metal plate 24 are in direct contact with each other. Attachment screws 26 (attachment members) each have a length sufficient to extend through the heat dissipations 14, and are arranged into a state of sticking out of hole portions 24a of the fixation metal plate 24. The attachment screws 26 and the heat dissipation fins 14 are thermally connected to each other via heat transfer members 29.

The electronic apparatus 10 can be assembled according to the above-described method.

Figure 4A:
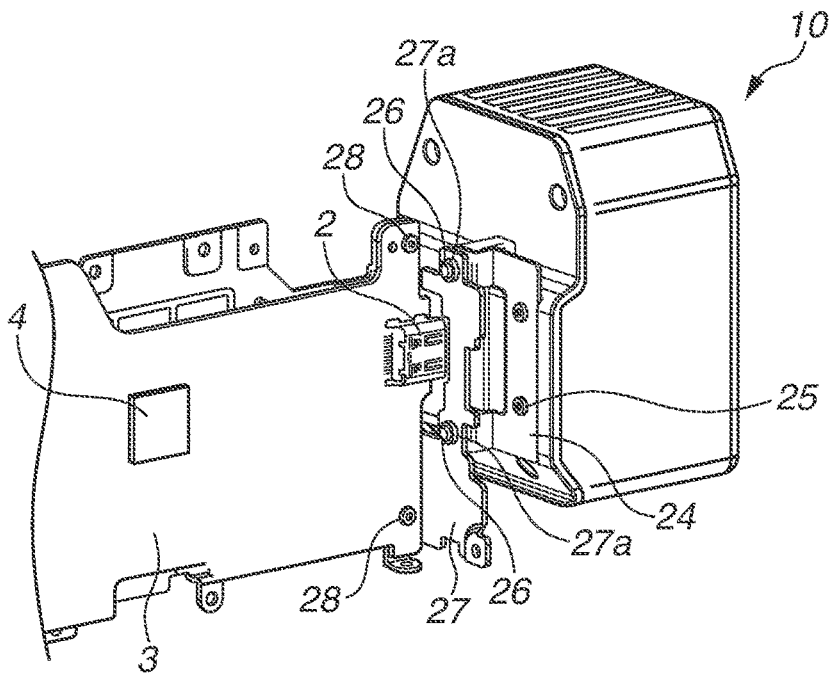
FIG. 4A is a perspective view of the electronic apparatus and the imaging apparatus in an attached state according to the first exemplary embodiment of the present disclosure.
Figure 4B:
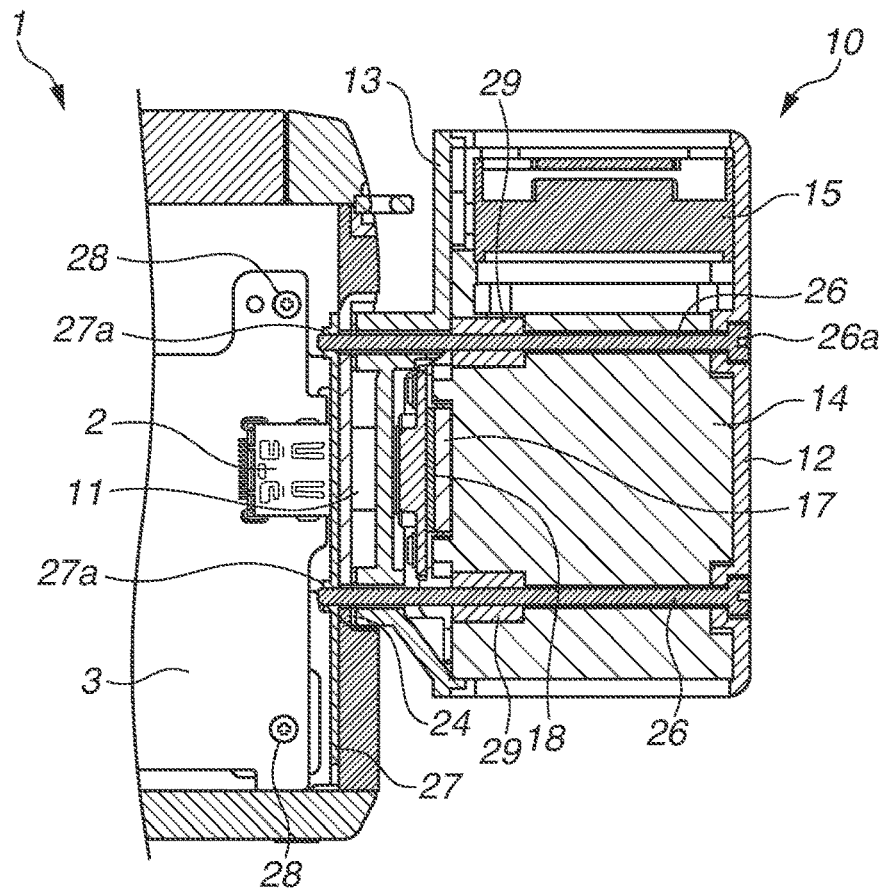
FIG. 4B is a cross-sectional view of the electronic apparatus and the imaging apparatus in the attached state according to the first exemplary embodiment of the present disclosure.

A method for attaching the electronic apparatus 10 to the imaging apparatus 1 will be described. FIG. 4A is an exploded perspective view illustrating an attachment state. The exterior of the imaging apparatus 1 and the like are omitted in FIG. 4A. FIG. 4B is a cross-sectional view at the time of the attachment. The control board 3, on which the control IC 4 serves as a heat source, is fixed to a metallic chassis 27 (a fixation unit) using screws 28. Screw holes 27a are provided on the chassis 27, and are arranged on the both sides of the receptacle connector 2. The attachment screws 26 are disposed at positions corresponding to the screw holes 27a of the chassis 27, and the electronic apparatus 10 is fixed to the imaging apparatus 1 by connecting the plug 11 of the electronic apparatus 10 to the receptacle connector 2 and tightening the attachment screws 26. The fixation using the attachment screws 26 can prevent the electronic apparatus 10 from falling off even when an external force is applied to the electronic apparatus 10. Further, the layout of the attachment screws 26 on the both sides of the receptacle connector 2 can make the electronic apparatus 10 further robust against falling off even when the electronic apparatus 10 is twisted outward or is subjected to a load from various directions. Further, fastening the fixation metal plate 24 together with the attachment screws 26 can establish such a configuration that, even when an excessive external force is applied to the electronic apparatus 10, the fixation metal plate 24 bears the external force, thus preventing breakage of the plug 11. In the present exemplary embodiment, the plug 11 and the receptacle connector 2 are not electrically connected, but an electrically connectable plug may be used. In such a case, a circuit board with the plug 11 mounted thereon is disposed inside the electronic apparatus 10, so that the electronic apparatus 10 can be controlled from the imaging apparatus 1 side. In this case, a stress on a mounted terminal of the plug 11 and an element on the circuit board can be eased by the fixation metal plate 24.

The electronic apparatus 10 can be attached to the imaging apparatus 1 by the above-described method.

Figure 5:
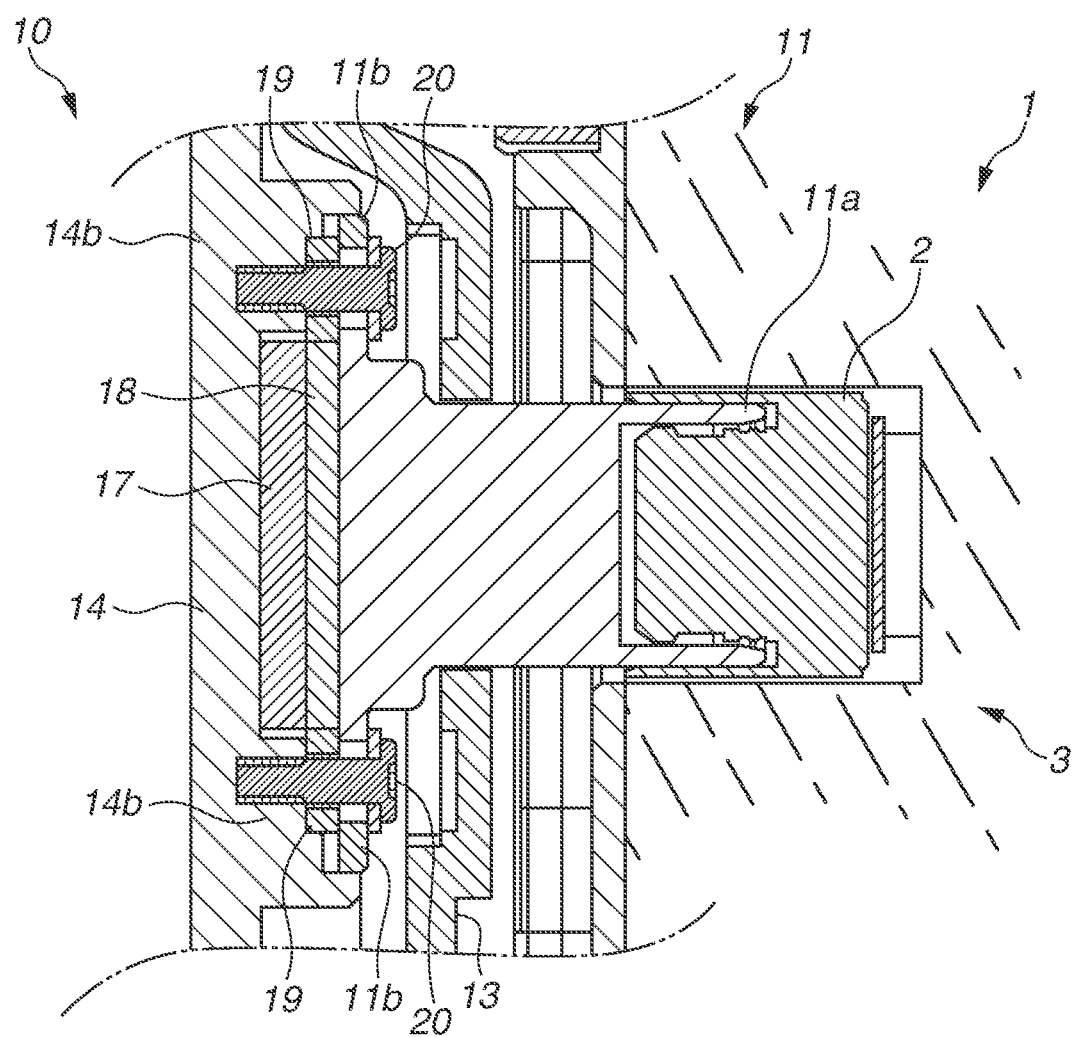
FIG. 5 is a cross-sectional view of the electronic apparatus and the imaging apparatus in the attached state according to the first exemplary embodiment of the present disclosure.

Next, a cooling operation of the electronic apparatus 10 will be described with reference to FIG. 5. FIG. 5 is a cross-sectional view of the electronic apparatus 10 and the imaging apparatus 1 according to the present exemplary embodiment. FIG. 5 illustrates a state in which the electronic apparatus 10 is attached to the imaging apparatus 1. As described above, when the imaging apparatus 1, for example, captures a moving image or continuously captures still images at a high speed for a long time, the temperature of the control IC 4 increases, the heat generated at the control IC 4 propagates to, for example, the conductive layer and/or the insulating layer of the control board 3, and the temperature of the control board 3 increases. The heat generated at the control IC 4 then also propagates to the receptacle connector 2 mounted on the control board 3 and the temperature of the receptacle connector 2 increases. When the cooling operation of the electronic apparatus 10 is started by operating the operation button 12c with the electronic apparatus 10 attached to the imaging apparatus 1, the temperature of the flat surface in contact with the heat transfer rubber 18 reduces by the action of the effect of the Peltier device 17. The plug 11 is then cooled via the heat transfer rubber 18, and the receptacle connector 2 physically connected to the plug 11 is also cooled. As a result, the increases in the temperatures of the control board 3 and the control CI 4 are reduced, so that the imposition of an operational limit on, for example, the moving image capturing or the high-speed continuous still image capturing of the imaging apparatus 1 is avoidable. Further, at this time, the temperature of the flat surface of the Peltier device 17 that faces the heat dissipation fins 14 increases. If the temperature undesirably unstoppably increases, the heat generation therefrom might make the operation of the Peltier device 17 instable or cause breakage of the semiconductor forming the Peltier device 17. Thus, the heat generated on the heat generation surface side of the Peltier device 17 is transferred to the heat dissipation fins 14 by placing the heat generation surface of the Peltier device 17 in planar contact with the heat dissipation fins 14. The transferred heat propagates to the plurality of fins 14c. Further, the warmed air staying near the fins 14c of the heat dissipation fins 14 is exhausted outward by driving the fan 15 to suck external air to generate a flow of an air current in the flow path formed inside the electronic apparatus 10. Performing such an operation can control the increase in the temperature on the heat generation surface side of the Peltier device 17 to stabilize the operation of the Peltier device 17, thus preventing breakage of the semiconductor.

If the heat transferred from the heat generation surface of the Peltier device 17 to the heat dissipation fins 14 is transferred to the heat absorption surface side of the Peltier device 17 via the fixation unit 11b, the effect of reducing the increases in the temperatures of the control board 3 and the control IC 4 with the aid of the operation of the Peltier device 17 might drop. Thus, providing of the resin washers 19 between the fixation unit 11b of the plug 11 and the fixation unit 14b of the heat dissipation fins 14 as described above hinders the transfer of the heat delivered from the heat generation surface of the Peltier device 17 to the heat dissipation fins 14 to the heat absorption surface side of the Peltier device 17 via the fixation unit 11b. Thus, the providing of the resin washers 19 contributes to causing the cooling effect exerted by the Peltier device 17 to further efficiently work. Here, the heat flowing around to the heat absorption surface side of the Peltier device 17 can be further reduced by, for example, further adding resin washers intended for thermal insulation between the fixation unit 11b and the bearing surfaces of the head portions of the screws 20.

The control board 3 is fixed to the chassis 27, and the heat of the control IC 4 is transferred from the control board 3 to the chassis 27. The heat transferred to the chassis 27 is transferred to the attachment screws 26 by tightening the attachment screws 26 into the screw holes 27a provided on the chassis 27. The chassis 27 and the attachment screws 26 are kept in strong close contact with each other at the screw portions of the screws 26, and this facilitates the transfer of the heat. The heat transferred to the attachment screws 26 is transferred to the heat dissipation fins 14 via the heat transfer members 29. The heat transfer members 29 are elastic and thermally conductive rubbers, and are configured to be arranged in close contact between the attachment screws 26 and the heat dissipation fins 14. As another heat transfer method for thermally connecting the attachment screws 26 and the heat dissipation fins 14, for example, thermally conductive grease may be loaded or the attachment screws 26 may be biased toward the heat dissipation fins 14 using a metallic spring.

The temperatures of the attachment screws 26 increase due to the heat transferred from the control board 3. In this case, screw heads 26a of the attachment screws 26 may be made from resin. This hinders increases in the temperatures of the screw heads 26a because heat is less transmittable through resin than metal, although the heat is transferred from the attachment screws 26 to the heat dissipation fins 14. As a result, the imaging apparatus operator can be prevented from touching a hot portion when performing the attachment operation.

The electronic apparatus 10 is structured in such a manner that the heat is also transferred to the fixation metal plate 24 fastened together with the aid of the tightening of the attachment screws 26. The fixation metal plate 24 is fixed to the fixation unit 14h of the heat dissipation fins 14 using the screws 25, and the heat is also transferred to the heat dissipation fins 14 via the fixation metal plate 24. The heat transferred along each of the route via the attachment screws 26 and the route via the fixation metal plate 24 is exhausted outward by the driving of the fan 15. The cooling performance can be improved by transferring the heat using the screw fixation in addition to the cooling with the aid of the plug 11. Further, the fixation can stabilize the contact in each heat route and reduce a variation in the cooling performance.

An electronic contact that allows the imaging apparatus 1 to establish signal communication with another electronic apparatus is further formed on the receptacle connector 2. The connection unit 11a of the plug 11 mainly includes a metallic material, but, for example, an insulating resin piece is provided inside the connection unit 11a at a portion close to the electronic contact portion of the receptacle connector 2. Alternatively, this portion is subjected to processing such as applying an insulating coating material or sufficiently securing a space to the electronic contact portion. Thus, the plug 11 is configured to prevent electric short-circuiting between electric contacts of the receptacle connector 2 via the plug 11 when the electronic apparatus 10 is attached to the imaging apparatus 1. As described above, the heat transfer rubber 18 is disposed between the Peltier device 17 and the plug 11, and is fixedly held in a state of being pressed by a predetermined amount of pressure. If the electronic apparatus 10 is configured to cool the plug 11 by bringing the plug 11 into direct contact with the Peltier device 17 without setting the heat transfer rubber 18, the contact surfaces of the Peltier device 17 and the plug 11 would have to satisfy high surface accuracy for the both flat surfaces in order to avoid a partial contact, a linear contact, and a point contact therebetween. Such highly accurate flat surface processing may cause degradation of the yield of component manufacturing or an increase in component cost. Further, if an external force is applied to the electronic apparatus 10 when the electronic apparatus 10 is in use while being attached to the imaging apparatus 1, a load is also applied to the plug 11. However, the plug 11 and the Peltier device 17 are connected via the heat transfer rubber 18, so that the load is absorbed, thus reducing a load to be applied to the Peltier device 17.

At the time of the work of assembling the electronic apparatus 10, an electric driver may be used when the Peltier device 17 and the plug 11 are fixedly held to the heat dissipation fins 14 using the screws 20. These tools are used for tightening a screw using power of a motor, and an impact occurs when the screw is tightened or the tightening of the screw is completed. If the electronic apparatus 10 is configured to bring the plug 11 into direct contact with the Peltier device 17 without setting the heat transfer rubber 18, this configuration raises such a concern that the Peltier device 17 may be broken due to a direct transfer of such an impact from the plug 11, which is a rigid member, to the Peltier device 17. As a configuration aiming at reducing the breakage of the Peltier device 17 during the assembling work without setting the heat transfer rubber 18, one conceivable example thereof is a configuration that additionally sets coil springs at four portions between the fixation unit 11b of the plug 11 and the screws 20 and fixes the Peltier device 17 and the plug 11 by tightening the screws 20. This case can hinder the propagation of the impact at the time of the work of tightening the screws 20 to the Peltier device 17, but undesirably leads to the complication of the work when fixing the Peltier device 17 and the plug 11 by tightening the screws 20. Thus, the configuration in which the heat transfer rubber 18 is disposed between the Peltier device 17 and the plug 11 is more useful than other configurations in consideration of the breakage of the Peltier device 17 being prevented at the time of the assembling work, the workability of the assembling, and stably transferring the heat between the Peltier device 17 and the plug 11. A space of a predetermined amount may be provided between the heat generation surface of the Peltier device 17 and the heat dissipation fins 14, and a member equivalent to the heat transfer rubber 18 may be added in this space in order to stably transfer the heat. Alternatively, the electronic apparatus 10 may employ such a configuration that highly thermally conductive grease is applied between the heat generation surface of the Peltier device 17 and the heat dissipation fins 14.

In a case where the electronic apparatus 10 is attached to the imaging apparatus 1 and the imaging is performed while the electronic apparatus 10 is being put into operation, warm air is supposed to be continuously exhausted from the exhaust port 12a during the imaging. If the exhaust port 12a faces in the direction toward the subject, the subject or an object appearing in the angle of view might undesirably sway in a closeup imaging scene or the like and might be unable to be imaged as intended. If the exhaust port 12a faces in the direction toward the imaging apparatus operator, it is concerned that the warm air might keep hitting the face or the hand of the imaging apparatus operator during the imaging, which is annoying. Thus, it is desirable to set the direction in which the warm air is exhausted from the exhaust port 12a in such a manner that the warm air is exhausted in a direction in parallel with a plane orthogonal to the direction of the optical axis of the imaging apparatus 1. Further, the warmed air is expanded, and the unit weight thereof reduces. Thus, it is desirable that the exhaust direction in which the attached electronic apparatus 10 exhausts the warm air be set in such a manner that the warm air is exhausted in the opposite direction of the vertical direction, when a tripod socket is placed below the imaging apparatus 1, in other words, arranged at a normal position. An operation of efficiently exhausting the air without resisting the movement of the warm air can be achieved by forming the exhaust direction in the opposite direction of the vertical direction. In other words, it is desirable to erect the fins 14c of the heat dissipation fins 14 in the direction parallel with the attachment direction in which the electronic apparatus 10 is connected in the case where the connection portion of the external interface of the imaging apparatus 1 is disposed at the side surface portion of the housing as illustrated in FIGS. 1A to 1C, and 2A and 2B. It is desirable to arrange a plurality of metallic flat plates forming the fins 14c to extend in parallel with the vertical direction. Further, configuring of the exhaust direction of the duct 12d in a linear manner in the opposite direction of the vertical direction advantageously affects the cooling operation.

The imaging apparatus 1 is configured to allow the electronic apparatus 10 to be detachably attached thereto, and is cooled by the external interface being cooled. Further, the imaging apparatus 1 is fixed to the electronic apparatus 10 using the attachment screws 26 and the fixation metal plate 24.

According to the present exemplary embodiment, the heat in the imaging apparatus 1 is released, thus avoiding the imposition of an operational limit in a scene such as moving image capturing or high-speed continuous still image capturing lasting for a long time. Further, the falling off of the electronic apparatus 10, the breakage of the plug 11, and the like can be prevented.

Figure 6:
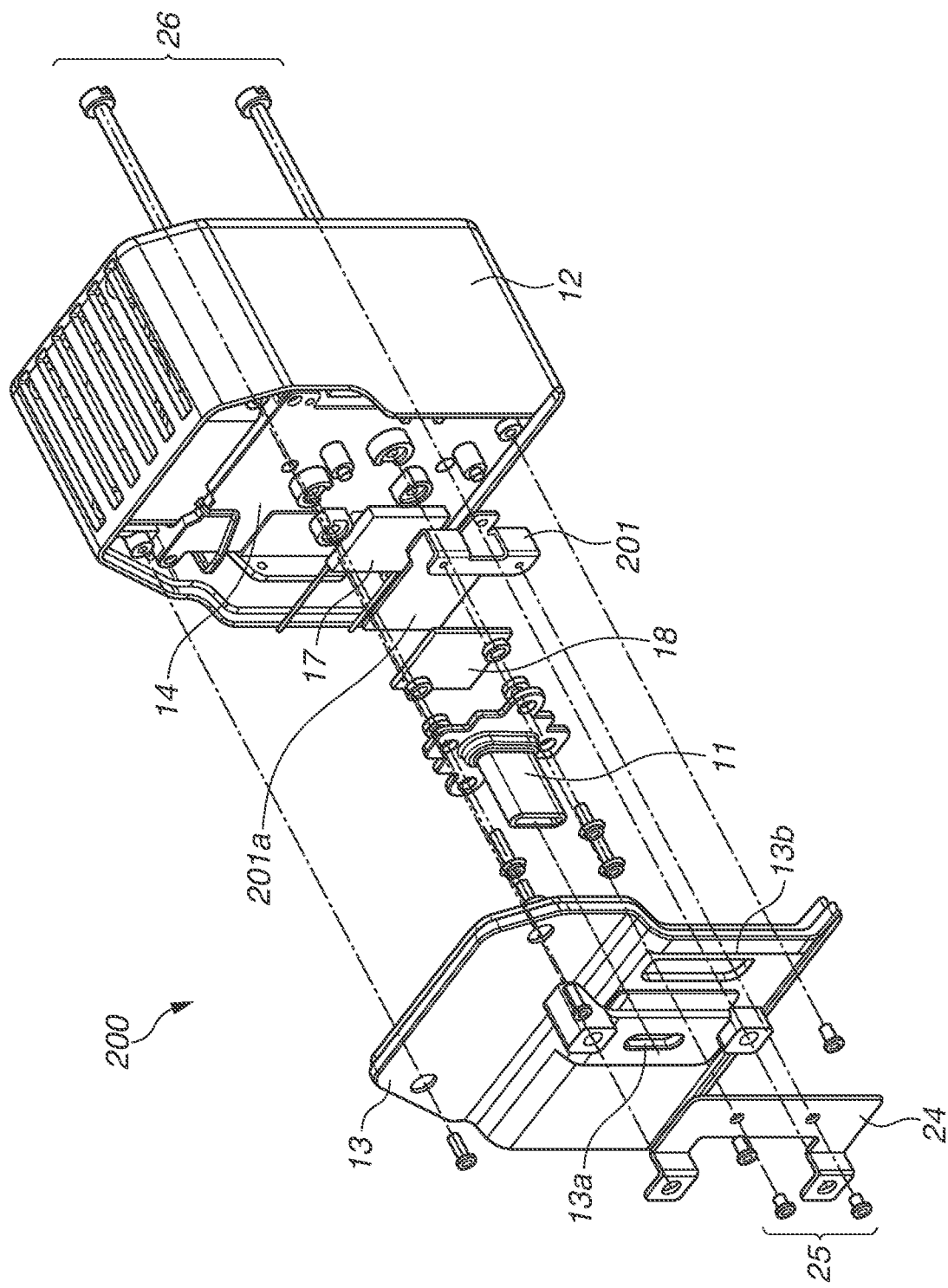
FIG. 6 is an exploded perspective view of an electronic apparatus (a heat dissipater) according to a second exemplary embodiment of the present disclosure.
Figure 7A:
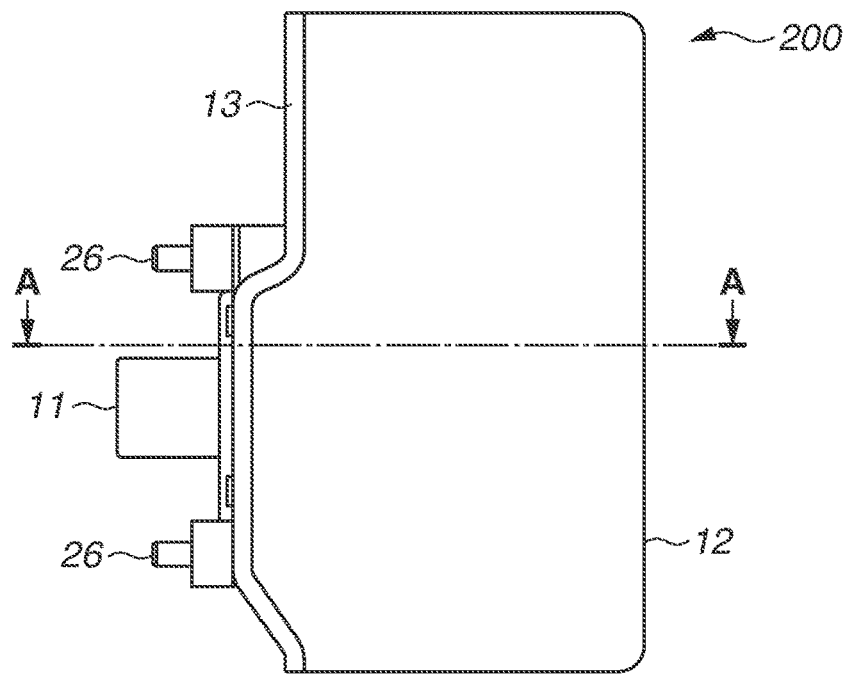
FIG. 7A is a side view of the electronic apparatus according to the second exemplary embodiment of the present disclosure.
Figure 7B:
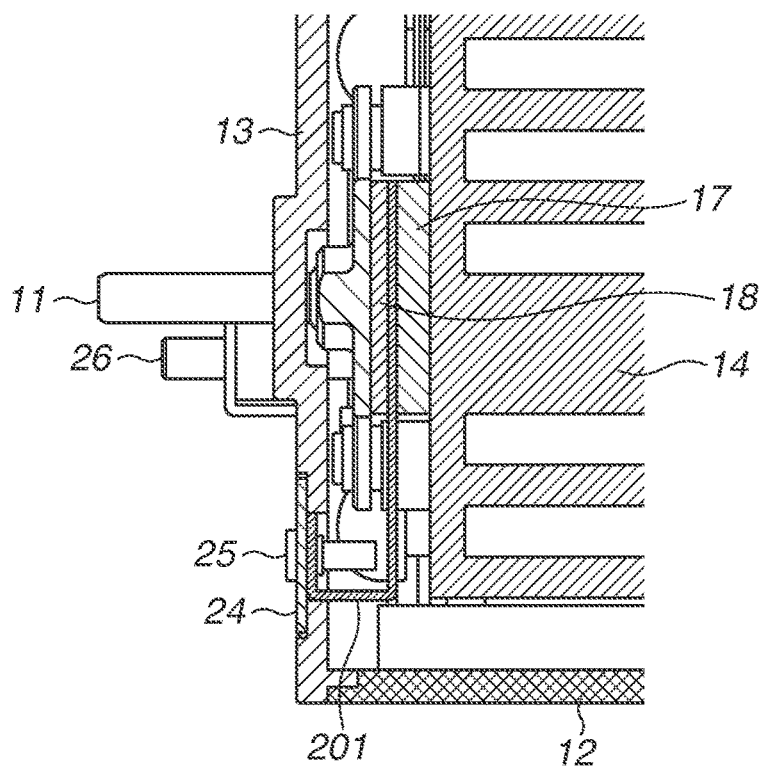
FIG. 7B is a cross-sectional view of the electronic apparatus according to the second exemplary embodiment of the present disclosure, taken along a line A-A.

A second exemplary embodiment of the present disclosure will be described below. Next, an electronic apparatus 200 according to the second exemplary embodiment of the present disclosure will be described with reference to FIGS. 6 and 7A and 7B. In the electronic apparatus 200, a heat transfer metal plate 201 is added to the electronic apparatus 10 described in the first exemplary embodiment. The other basic configuration and the operation method of the electronic apparatus 200 are similar to those of the electronic apparatus 10. Similar portions to the configuration of the electronic apparatus 10 will be described, using the same reference numerals and omitting the detailed descriptions thereof. FIG. 6 is an exploded perspective view of the electronic apparatus 200 according to the present exemplary embodiment. FIG. 7A illustrates a side view of the electronic apparatus 200 according to the present exemplary embodiment, and FIG. 7B illustrates the plug 11 in cross section taken along a line A-A.

The fixation metal plate 24 is fixed to the heat transfer metal plate 201 with the cover 13 sandwiched therebetween using the screws 25. The opening portion 13b is provided on the cover 13, and the fixation metal plate 24 and the heat transfer metal plate 201 are in direct contact with each other.

The heat transfer metal plate 201 includes an extension portion 201a, and the extension portion 201a is disposed between the plug 11 and the Peltier device 17. The heat transfer metal plate 201 is in close contact with the plug 11 via the heat transfer rubber 18.

The heat transfer metal plate 201 is thermally connected to the Peltier device 17 via not-illustrated thermally conductive grease. Thus, the heat transfer metal plate 201 and the heat dissipation fins 14 are not in direct contact with each other, in other words, the heat transfer metal plate 201 and the heat dissipation fins 14 are thermally isolated from each other.

The electronic apparatus 200 is fixed by connecting the plug 11 to the receptacle connector 2 of the imaging apparatus 1 and also tightening the attachment screws 26. When the cooling operation of the electronic apparatus 200 is started, the temperature of the flat surface in contact with the heat transfer metal plate 201 reduces by the action of the effect of the Peltier device 17. The plug 11 is cooled via the heat transfer rubber 18 in contact with the heat transfer metal plate 201, and the receptacle connector 2 connected to the plug 11 is also cooled. The material of the heat transfer metal plate 201 is aluminum or copper having high thermal conductivity. The fixation metal plate 24 fixedly screwed to the heat transfer metal plate 201 cooled by the Peltier device 17 is also cooled. In a case where the electronic apparatus 200 is fixed to the imaging apparatus 1 using the attachment screws 26, the chassis 27 is cooled by the fixation metal plate 24 and the temperatures of the control board 3 and the control IC 4 fixed to the chassis 27 can be reduced. The temperature of the heat dissipation fins 14 in contact with the heat generation surface of the Peltier device 17 increases due to the heat generation of the Peltier device 17. However, the electronic apparatus 200 is configured in such a manner that the heat transfer metal plate 201 and the heat dissipation fins 14 are not in direct contact with each other, thus preventing the heat of the heat generation surface of the Peltier device 17 from being transferred to the heat absorption surface of the Peltier device 17 via the heat dissipation fins 14 and the heat transfer metal plate 201. The attachment screws 26 can also prevent the heat of the heat dissipation fins 14 from being transferred to the imaging apparatus 1 via the screws 26 by being made from resin except for the screw tips.

According to the second exemplary embodiment, the cooling effect can be enhanced while the falling off is prevented between the imaging apparatus 1 and the electronic apparatus 200 by placing the heat transfer metal plate 201 thermally connected to the fixation metal plate 24 in contact with the heat absorption surface of the Peltier device 17 in this manner.

Figure 8A:
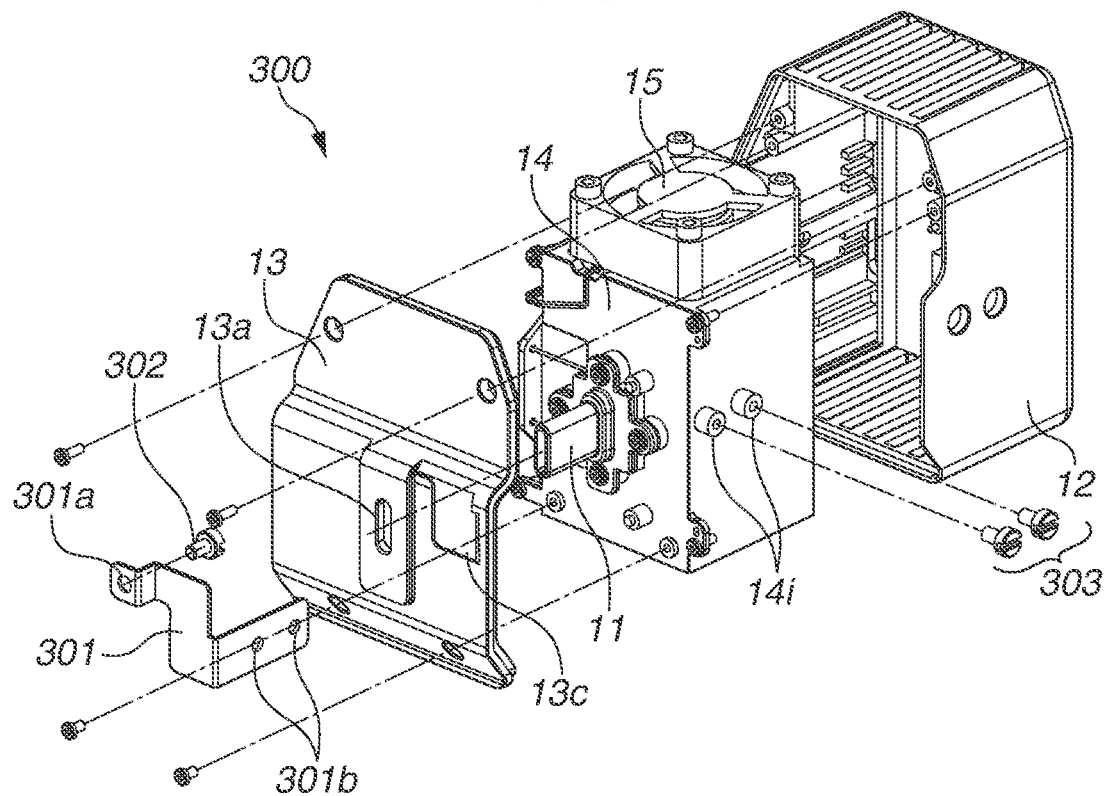
FIG. 8A is an exploded perspective view of an electronic apparatus (a heat dissipater) according to a third exemplary embodiment of the present disclosure.
Figure 8B:
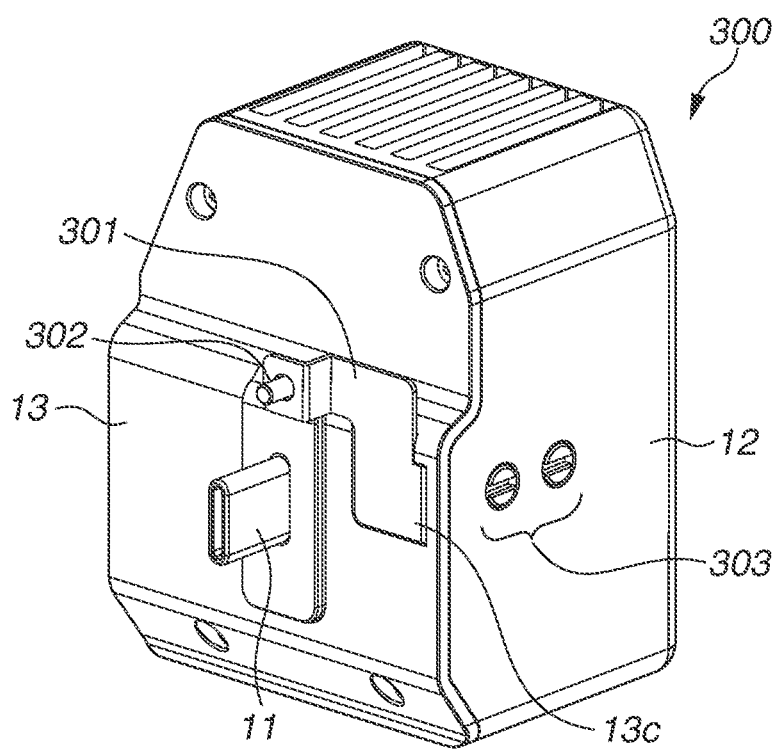
FIG. 8B is a perspective view of the electronic apparatus (the heat dissipater) according to the third exemplary embodiment of the present disclosure.
Figure 9:
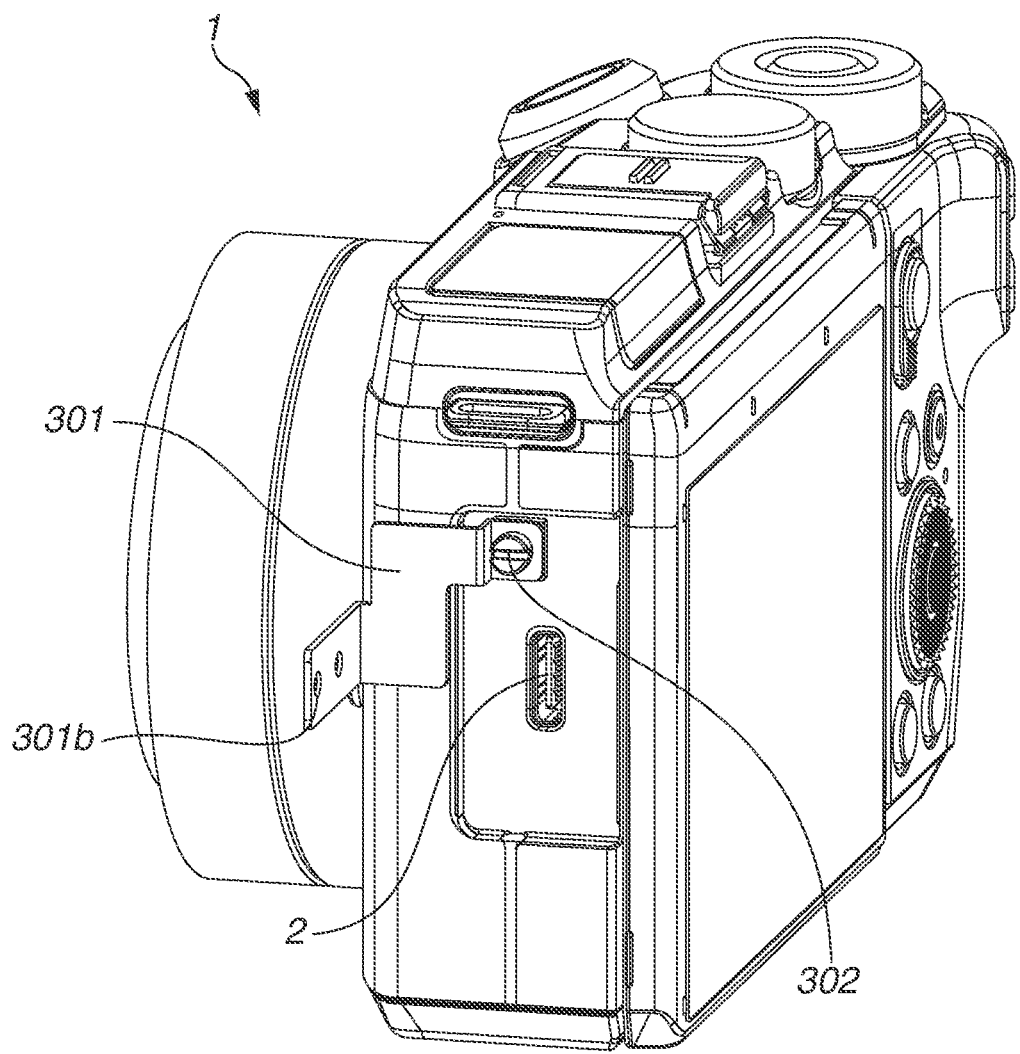
FIG. 9 illustrates a state in which a fixation metal plate 301 is attached to the imaging apparatus according to the third exemplary embodiment of the present disclosure.

A third exemplary embodiment of the present disclosure will be next described. An electronic apparatus 300 according to the third exemplary embodiment of the present disclosure will be described with reference to FIGS. 8A and 8B and 9. The electronic apparatus 300 is different from the electronic apparatus 10 described in the first exemplary embodiment in the shape of a fixation metal plate 301, and a method for attaching the electronic apparatus 300 to the imaging apparatus 1 is changed. The other basic configurations are similar to the electronic apparatus 10. Portions similar to the configuration of the electronic apparatus 10 will be described, using the same reference numerals and omitting the detailed descriptions thereof. FIG. 8A is an exploded perspective view of the electronic apparatus 300 according to the present exemplary embodiment, and FIG. 8B illustrates the electronic apparatus 300 in a state of being fixed to the imaging apparatus 1 according to the present exemplary embodiment and illustrates the position at which the fixation metal plate 301 is attached to the electronic apparatus 300. FIG. 9 illustrates a state in which the fixation metal plate 301 is attached to the imaging apparatus 1 according to the present exemplary embodiment. The fixation metal plate 301 includes a hole portion 301a fixed to the imaging apparatus 1, and is fixed to the chassis 27 inside the imaging apparatus 1 using an attachment screw 302. The fixation metal plate 301 includes screw holes at an extension portion 301b extending substantially perpendicularly to the attachment surface of the imaging apparatus 1, i.e., in parallel with the direction in which the plug 11 is inserted. The extension portion 301b is inserted through a hole portion 13c of the cover 13, and is fixedly screwed to a fixation unit 14i of the heat dissipation fins 14 using fixation screws 303.

A method for attaching the electronic apparatus 300 to the imaging apparatus 1 will be described. As illustrated in FIG. 9, the fixation metal plate 301 is screwed to be fixed to the imaging apparatus 1 using the attachment screw 302 in advance. The plug 11 of the electronic apparatus 300 is connected to the receptacle connector 2. At the same time, the fixation metal plate 301 is inserted through the hole portion 13c of the cover 13. At this time, the screw holes of the extension portion 301b of the fixation metal plate 301 are located at the same position as the fixation unit 14i of the heat dissipation fins 14, and the fixation between the electronic apparatus 300 and the imaging apparatus 1 is completed by tightening the fixation screws 303 from the side surface.

When the cooling operation of the electronic apparatus 300 is started, the temperature of the flat surface in contact with the heat transfer metal plate 201 reduces by the action of the effect of the Peltier device 17. The plug 11 is cooled via the heat transfer rubber 18 in contact with the heat transfer metal plate 201, and the receptacle connector 2 physically connected to the plug 11 is also cooled. The control board 3 on which the control IC 4 serving as a heat source is mounted is fixed to the chassis 27. The heat of the control IC 4 is transferred to the fixation metal plate 301 fixed to the chassis 27. The fixation metal plate 301 is fixed to the heat dissipation fins 14, and is cooled by driving the fan 15. In this manner, the heat in the imaging apparatus 1 can be dissipated via the fixation metal plate 301 along with the cooling using the Peltier device 17. Further, the fixation metal plate 301 can be attached to the imaging apparatus 1 in advance. Thus, even in a case where the position of the screw fixation on the imaging apparatus side is different from the present exemplary embodiment, the electronic apparatus 300 can be attached by preparing another fixation metal plate 301 adjusted according to this position.

According to the present exemplary embodiment, the electronic apparatus 300 can be attached to various apparatuses without changing the internal components of the electronic apparatus 300 except for the fixation metal plate 301, thus achieving further high versatility.

OTHER EXEMPLARY EMBODIMENTS

Having described the representative exemplary embodiments of the present disclosure, some embodiments are not limited to these exemplary embodiments and can be modified and changed in various manners within the range of the spirit thereof.

According to the present disclosure, it is possible to provide the externally connectable electronic apparatus that reduces the increase in the temperature inside the imaging apparatus while the falling off of the cooling apparatus attached to the imaging apparatus is prevented.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2021-069720, which was filed on Apr. 16, 2021 and which is hereby incorporated by reference herein in its entirety.

What is claimed is:

1. An electronic apparatus comprising:
an interface unit comprising a connection unit;
a heat transfer unit;

a heat dissipation unit; and a fixation member, wherein the connection unit is attachable to an interface terminal of an external apparatus, wherein the fixation member is couplable to a fixation unit of the external apparatus, and wherein, when the electronic apparatus is attached to the external apparatus, the heat dissipation unit, the heat transfer unit, and the interface unit are arranged in a layered manner in this order and are thermally coupled, and, along therewith, the fixation member is thermally coupled to the heat dissipation unit and the fixation unit.

2. The electronic apparatus according to claim 1, wherein, when the fixation member and the fixation unit are coupled to each other, the fixation member and the fixation unit are fixed using an attachment member extending through the heat dissipation unit.

3. The electronic apparatus according to claim 1, wherein the fixation unit is disposed on two sides of the interface unit.

4. The electronic apparatus according to claim 1, wherein an elastic member is disposed between the interface unit and the heat transfer unit.

5. The electronic apparatus according to claim 1, further comprising a heat transfer metal plate thermally coupled to the fixation member between the interface unit and the heat transfer unit, the heat transfer metal plate being thermally isolated from the heat dissipation unit.

6. The electronic apparatus according to claim 1, wherein, in the fixation member, an extension portion that extends from an attachment surface through a hole portion disposed on a cover covering the interface unit is fixed to the heat dissipation unit.

* * * * *